(12) United States Patent
Kim et al.

(10) Patent No.: US 9,161,443 B2
(45) Date of Patent: Oct. 13, 2015

(54) WHOLLY AROMATIC POLYESTER AMIDE COPOLYMER RESIN, POLYMER FILM INCLUDING THE WHOLLY AROMATIC POLYESTER AMIDE COPOLYMER RESIN, FLEXIBLE METAL-CLAD LAMINATE INCLUDING THE POLYMER FILM, AND FLEXIBLE PRINTED CIRCUIT BOARD INCLUDING THE FLEXIBLE METAL-CLAD LAMINATE

(75) Inventors: Yang Seob Kim, Daejeon (KR); Bon Hyeok Gu, Hwaseong-si (KR); Mi Jeong Kim, Daejeon (KR); Mahn Jong Kim, Daejeon (KR)

(73) Assignee: SHENZHEN WOTE ADVANCED MATERIALS CO., LTD., Shenzhen (CN)

( * ) Notice: Subject to any disclaimer, the term of this patent is extended or adjusted under 35 U.S.C. 154(b) by 17 days.

(21) Appl. No.: 14/113,336

(22) PCT Filed: Nov. 28, 2011

(86) PCT No.: PCT/KR2011/009104
§ 371 (c)(1),
(2), (4) Date: Oct. 22, 2013

(87) PCT Pub. No.: WO2012/153901
PCT Pub. Date: Nov. 15, 2012

(65) Prior Publication Data
US 2014/0284085 A1    Sep. 25, 2014

(30) Foreign Application Priority Data
May 6, 2011    (KR) .................. 10-2011-0043072

(51) Int. Cl.
*C08G 64/00* (2006.01)
*H05K 1/05* (2006.01)
*C08J 5/18* (2006.01)
*H05K 1/03* (2006.01)
*C08G 69/44* (2006.01)
*C08L 77/12* (2006.01)
*C08G 63/02* (2006.01)
*H05K 3/02* (2006.01)

(52) U.S. Cl.
CPC ................ *H05K 1/056* (2013.01); *C08G 69/44* (2013.01); *C08J 5/18* (2013.01); *C08L 77/12* (2013.01); *H05K 1/0353* (2013.01); *H05K 1/0393* (2013.01); *C08J 2377/12* (2013.01); *H05K 3/022* (2013.01); *Y10T 428/31681* (2015.04)

(58) Field of Classification Search
USPC .......................................... 528/184; 428/220
See application file for complete search history.

(56) References Cited

U.S. PATENT DOCUMENTS 6,706,851 B1    3/2004    Linemann et al.

FOREIGN PATENT DOCUMENTS

| KR | 19920000471 B1 | 1/1992 |
|----|----------------|--------|
| KR | 1020080103312 A | 11/2008 |
| KR | 1020100080082 A | 7/2010 |

OTHER PUBLICATIONS

International Search Report for International Application No. PCT/KR2011/009104 dated Jul. 30, 2012.
Written Opinion for International Application No. PCT/KR2011/009104 dated Jul. 30, 2012.

*Primary Examiner* — Terressa Boykin
(74) *Attorney, Agent, or Firm* — Osha • Liang LLP

(57) ABSTRACT

Provided are a wholly aromatic polyester amide copolymer resin, a polymer film containing the wholly aromatic polyester amide copolymer resin, a flexible metal clad laminate containing the polymer film, and a flexible printed circuit board employing the flexible metal clad laminate. The disclosed wholly aromatic polyester amide copolymer resin includes 5-25 parts by mole of a repeating unit (A) derived from an aromatic hydroxy carboxylic acid; 20-40 parts by mole of at least one repeating unit selected from the group consisting of a repeating unit (B) derived from an aromatic amine having a phenolic hydroxyl group and a repeating unit (B') derived from an aromatic diamine; 20-40 parts by mole of a repeating unit (C) derived from an aromatic dicarboxylic acid; 5-20 parts by mole of a repeating unit (D) derived from an aromatic diol; and 5-20 parts by mole of a repeating unit (E) derived from an aromatic amino carboxylic acid.

16 Claims, No Drawings

WHOLLY AROMATIC POLYESTER AMIDE COPOLYMER RESIN, POLYMER FILM INCLUDING THE WHOLLY AROMATIC POLYESTER AMIDE COPOLYMER RESIN, FLEXIBLE METAL-CLAD LAMINATE INCLUDING THE POLYMER FILM, AND FLEXIBLE PRINTED CIRCUIT BOARD INCLUDING THE FLEXIBLE METAL-CLAD LAMINATE

TECHNICAL FIELD

Disclosed are a wholly aromatic polyester amide copolymer resin, a polymer film containing the wholly aromatic polyester amide copolymer resin, a flexible metal clad laminate containing the polymer film, and a flexible printed circuit board employing the flexible metal clad laminate. More particularly, provided are a wholly aromatic polyester amide copolymer resin having improved bending endurance, a polymer film containing the wholly aromatic polyester amide copolymer resin, a flexible metal clad laminate containing the polymer film to have excellent bending endurance and dimensional stability, and a flexible printed circuit board employing the metal clad laminate.

BACKGROUND ART

Recently, the use of a flexible metal clad laminate for a flexible printed circuit board is gradually increasing due to miniaturization and multi-functionalization of devices using the flexible printed circuit boards. The flexible metal clad laminate is formed of two layers including a metal layer such as a copper foil or an aluminum foil and a polymer film layer.

The polymer film applied to the metal clad laminate for the flexible printed circuit board needs to satisfy the following main properties to be suitable for the performance of a semiconductor and the conditions of a semiconductor packaging manufacturing process.

(1) A low thermal expansion coefficient that may correspond to a metal thermal expansion coefficient (2) A low dielectric constant and dielectric stability in a high frequency region of 1 GHz or greater (3) Heat resistance to a reflow process at a temperature of about 260° C.

(4) Low hygroscopicity to improve reliability

A polyimide resin having high heat resistance is used in a casting manner to prepare a conventional metal foil coated with a resin. Also, a polyamic acid solution is coated on the metal foil and then heat treated under appropriate conditions to be cured to manufacture a flexible metal clad laminate. The flexible metal clad laminate has a structure in which a polyimide resin layer is formed on the metal foil. Accordingly, the flexible metal clad laminate has excellent bending endurance and heat resistance, which are inherent properties of the polyimide resin, but has problems such as a warpage phenomenon caused by a difference in thermal expansion coefficients of the polyimide resin layer and the metal foil, and low dimensional stability due to high hygroscopicity of the polyimide resin itself.

Recently, the use of a wholly aromatic liquid polyester resin having high heat resistance or Teflon has been reviewed as an alternative measure to the use of the polyimide resin in the manufacturing process of the flexible metal clad laminate. However, to manufacture a wholly aromatic liquid crystalline polyester resin solution (i.e., varnish), a solvent containing a halogen element such as chlorine is needed, but in this case, problems such as corrosion of the metal foil due to the halogen element during the manufacturing processes of the flexible metal clad laminate and the flexible printed circuit board may occur and thus, the use of a non-halogen solvent is needed.

DETAILED DESCRIPTION OF THE INVENTION

Technical Problem

According to an embodiment of the present invention, there are provided a wholly aromatic polyester amide copolymer resin including at least one repeating unit selected from the group consisting of a repeating unit (A) derived from an aromatic hydroxy carboxylic acid, a repeating unit (B) derived from an aromatic amine having a phenolic hydroxyl group, a repeating unit (B') derived from an aromatic diamine, a repeating unit (C) derived from an aromatic dicarboxylic acid, a repeating unit (D) derived from an aromatic diol, and a repeating unit (E) derived from an aromatic amino carboxylic acid in a predetermined ratio.

According to another embodiment of the present invention, there is provided a polymer film containing the wholly aromatic polyester amide copolymer resin.

According to another embodiment of the present invention, there is provided a flexible metal clad laminate containing the polymer film and a flexible printed circuit board employing the flexible metal clad laminate.

Technical Solution

According to an aspect of the present invention, there is provided a wholly aromatic polyester amide copolymer resin including 5-25 parts by mole of a repeating unit (A) derived from an aromatic hydroxy carboxylic acid;

20-40 parts by mole of at least one repeating unit selected from the group consisting of a repeating unit (B) derived from an aromatic amine having a phenolic hydroxyl group and a repeating unit (B') derived from an aromatic diamine;

20-40 parts by mole of a repeating unit (C) derived from an aromatic dicarboxylic acid;

5-20 parts by mole of a repeating unit (D) derived from an aromatic diol; and 5-20 parts by mole of a repeating unit (E) derived from an aromatic amino carboxylic acid.

The repeating unit (A) may be derived from at least one compound selected from the group consisting of para-hydroxy benzoic acid, meta-hydroxy benzoic acid, 6-hydroxy-2-naphthoic acid, 3-hydroxy-2-naphthoic acid, 1-hydroxy-2-naphthoic acid, and 2-hydroxy-1-naphthoic acid; the repeating unit (B) may be derived from at least one compound selected from the group consisting of 3-aminophenol, 4-aminophenol, 5-amino-1-naphthol, 8-amino-2-naphthol, and 3-amino-2-naphthol; the repeating unit (B') may be derived from at least one compound selected from the group consisting of 1,4-phenylenediamine, 1,3-phenylenediamine, 1,5-diaminonaphthalene, 2,3-diaminonaphthalene, and 1,8-diaminonaphthalene; the repeating unit (C) may be derived from at least one compound selected from the group consisting of isophthalic acid, naphthalene dicarboxylic acid, and terephthalic acid; The repeating unit (C) may be derived from at least one compound selected from the group containing isophthalic acid, naphthalene dicarboxylic acid and terephthalic acid; the repeating unit (D) may be derived from at least one compound selected from the group containing bisphenol A, resorcinol, 4,4'-biphenol and hydroquinone; and the repeating unit (E) may be derived from at least one compound selected from the group containing 4-aminobenzoic acid, 2-amino-naphthalene-6-carboxylic acid and 4'-amino-biphenyl-4-carboxylic acid.

The wholly aromatic polyester amide copolymer resin may have a weight average molecular weight of about 1,000 to about 100,000 and a glass transition temperature of about 200° C. to about 300° C.

According to another aspect of the present invention, there is provided a polymer film including a wholly aromatic polyester amide copolymer resin.

The polymer film may have a thermal expansion coefficient in one direction of 16 ppm/K or less.

The polymer film may have a dielectric constant (1 GHz) of 3.5 or less and dielectric loss (1 GHz) of 0.01 or less.

The polymer film may have a hygroscopicity of 0.5 wt % or less.

The polymer film may have a glass transition temperature of about 250° C. to about 350° C.

According to another aspect of the present invention, there is provided a flexible metal clad laminate containing a polymer film; and at least one metal foil disposed on at least one surface of the polymer film.

The metal foil may include at least one of a copper foil and an aluminum foil.

According to another aspect of the present invention, there is provided a flexible printed circuit board by etching a flexible metal clad laminate.

According to another aspect of the present invention, there is provided a flexible printed circuit board formed by printing a metal circuit pattern on at least one surface of the polymer film.

Advantageous Effects

According to an embodiment of the present invention, a wholly aromatic polyester amide copolymer resin having a similar bending endurance and thermal expansion coefficient but lower hygroscopicity, dielectric constant, and dielectric loss compared to a conventional material (for example, polyimide) may be provided.

According to another embodiment of the present invention, the wholly aromatic polyester amide copolymer resin may be included to provide a polymer film having high bending endurance, high dimensional stability, low hygroscopicity, a low dielectric constant and low dielectric loss.

According to another embodiment of the present invention, the wholly aromatic polyester amide copolymer resin may be included to provide a flexible metal clad laminate, and a flexible printed circuit board having a good bending property and high peel strength in addition to the properties of the polymer film.

BEST MODE

Hereinafter, a wholly aromatic polyester amide copolymer resin according to an embodiment of the present invention, a polymer film containing the wholly aromatic polyester amide copolymer resin, a flexible metal clad laminate containing the polymer film, and a flexible printed circuit board (FPCB) employing the flexible metal clad laminate are described in detail.

The wholly aromatic polyester amide copolymer resin according to an embodiment of the present invention includes 5-25 parts by mole of a repeating unit (A) derived from an aromatic hydroxy carboxylic acid; 20-40 parts by mole of at least one repeating unit selected from the group consisting of a repeating unit (B) derived from an aromatic amine having a phenolic hydroxyl group and a repeating unit (B') derived from an aromatic diamine; 20-40 parts by mole of a repeating unit (C) derived from an aromatic dicarboxylic acid; 5-20 parts by mole of a repeating unit (D) derived from an aromatic diol; and 5-20 parts by mole of a repeating unit (E) derived from an aromatic amino carboxylic acid.

When the content of the repeating unit (A) is within the range above, the wholly aromatic polyester amide copolymer resin has thermal properties at an appropriate level.

When a total content of the contents of the repeating unit (B) and the repeating unit (B') is within the range above, the wholly aromatic polyester amide copolymer resin has an appropriate level of solubility with respect to the solvent and an appropriate level of hygroscopicity.

When the content of the repeating unit (C) is within the range above, the wholly aromatic polyester amide copolymer resin has an appropriate level of solubility with respect to the solvent.

When the content of the repeating unit (D) is within the range above, the wholly aromatic polyester amide copolymer resin has a high bending endurance.

When the content of the repeating unit (E) is within the range above, the wholly aromatic polyester amide copolymer resin may have a high level of solubility with respect to the solvent, and if applied to a flexible metal clad laminate as a polymer film, the wholly aromatic polyester amide copolymer resin may provide an excellent bending property and high peel strength.

The repeating unit (A) may be derived from at least one compound selected from the group consisting of para-hydroxy benzoic acid, meta-hydroxy benzoic acid, 6-hydroxy-2-naphthoic acid, 3-hydroxy-2-naphthoic acid, 1-hydroxy-2-naphthoic acid, and 2-hydroxy-1-naphthoic acid; the repeating unit (B) may be derived from at least one compound selected from the group consisting of 3-aminophenol, 4-aminophenol, 5-amino-1-naphthol, 8-amino-2-naphthol, and 3-amino-2-naphthol; and the repeating unit (B') may be derived from at least one compound selected from the group consisting of 1,4-phenylenediamine, 1,3-phenylenediamine, 1,5-diaminonaphthalene, 2,3-diaminonaphthalene, and 1,8-diaminonaphthalene; the repeating unit (C) may be derived from at least one compound selected from the group consisting of an isophthalic acid, a naphthalene dicarboxylic acid, and a terephthalic acid; the repeating unit (D) may be derived from at least one compound selected from the group containing bisphenol A, resorcinol, 4,4'-biphenol and hydroquinone; and the repeating unit (E) may be derived from at least one compound selected from the group containing 4-aminobenzoic acid, 2-amino-naphthalene-6-carboxylic acid and 4'-amino-biphenyl-4-carboxylic acid.

(1) An aromatic hydroxy carboxylic acid or an ester forming derivative thereof; (2) at least one selected from the group consisting of an aromatic amine having a phenolic hydroxyl group or an amide forming derivative thereof and an aromatic diamine or an amide forming derivative thereof; (3) an aromatic dicarboxylic acid or an ester forming derivative thereof; (4) an aromatic diol or an ester-forming derivative thereof; and (5) an aromatic amino carboxylic acid, an amide-forming derivative thereof or an ester-forming derivative thereof may be polymerized to obtain the wholly aromatic polyester amide copolymer resin.

Also, the amide forming derivative of the aromatic amine, the aromatic diamine, and/or the aromatic amino carboxylic acid may be for forming an amide bond between an amine group thereof and carboxylic acids.

Also, the ester forming derivative of the aromatic diol may be for forming an ester bond between a hydroxyl group thereof and carboxylic acids.

The wholly aromatic polyester amide copolymer resin prepared as the above may be dissolved in a solvent.

Also, the wholly aromatic polyester amide copolymer resin may have a weight average molecular weight of about 1,000 to about 100,000 and a glass transition temperature of about 200° C. to about 300° C.

The wholly aromatic polyester amide copolymer resin may be prepared according to the following method. Hence, the wholly aromatic polyester amide copolymer resin may be prepared by a method of acylating a hydroxyl group and/or amine group of an aromatic hydroxy carboxylic acid corresponding to the repeating unit (A), an aromatic amine having a phenolic hydroxyl group corresponding to the repeating unit (B), an aromatic diamine corresponding to the repeating unit (B'), an aromatic diol corresponding to the repeating unit (D), and/or an aromatic amino carboxylic acid corresponding to the repeating unit (E) with an acid anhydride to obtain acetylated products, and reacting the acetylated products with an aromatic dicarboxylic acid, an aromatic hydroxy carboxylic acid and/or aromatic amino carboxylic acid (hence, an ester exchange reaction and/or an amide exchange reaction) to melt polymerize the same.

In the acylation reaction, the content of the acid anhydride added may be about 1.0 to about 1.2 times, for example, about 1.0 to about 1.1 times greater than the total content of a hydroxyl group and an amine group, in terms of a chemical equivalent. When the content of the acid anhydride added is within the range above, coloration of the wholly aromatic polyester amide copolymer resin decreases, sublimation of monomer materials in the wholly aromatic polyester amide copolymer resin does not occur, and the generation of a phenol gas decreases. The acylation reaction may be performed at a temperature of about 130° C. to about 170° C. for about 30 minutes to about 8 hours, for example, at about 140° C. to about 160° C. for 1 hour to 3 hours.

The acid anhydride used in the acetylation reaction may include acetic anhydride, propionic anhydride, isobutyric anhydride, valeric anhydride, pivalic anhydride, butyric anhydride, or a combination thereof.

The ester exchange reaction and the amide exchange reaction may be performed at a temperature of about 130° C. to about 400° C. and at a temperature increasing rate of about 0.1° C./min to about 2□/min, for example, at a temperature of about 140° C. to about 350□ and at a temperature increasing rate of about 0.3° C./min to about 1° C./min.

Also, acid byproducts and unreacted anhydrides may be discharged out of the reaction system by evaporation or distillation during the ester exchange reaction and/or the amide exchange reaction to move a chemical equilibrium and increase a reaction rate.

Also, the acylation reaction, the ester exchange reaction and the amide exchange reaction may occur in the presence of a catalyst. The catalyst may include magnesium acetate, tin acetate, tetrabutyl titanate, lead acetate, sodium acetate, potassium acetate, antimony trioxide, N,N-dimethyl amino pyridine, N-methylimidazole, or a combination thereof. The catalyst may be simultaneously introduced with monomers and an acylation reaction and an ester exchange reaction may occur in the presence of the catalyst.

A condensation polymerization by the ester exchange reaction and the amide exchange reaction may be performed by a melt polymerization, or a combination of a melt polymerization and a solid phase polymerization Any polymerization reactor used for a melt polymerization may be a reactor generally used for a high viscosity reaction in which an agitator is provided. Here, the same reactor as a reactor for an acylation process and a polymerization reactor for a melt polymerization process may be used and a different reactor may be used for each process.

A pre-polymer discharged from the melt polymerization process may be pulverized to prepare flake or powder and then polymerized to perform a solid phase polymerization. The solid phase polymerization may be performed by heat treating in a solid state at a temperature of about 250° C. to about 450° C. for about 1 hour to about 30 hours under an inert atmosphere such as nitrogen atmosphere. Also, the solid phase polymerization may be performed under agitation or without agitation. Also, a reactor in which a suitable agitator is provided may be used in combination as a melt polymerization reactor and a solid phase polymerization reactor.

The wholly aromatic polyester amide copolymer resin may be pelleted by using to a known method and then molded, or fiberized by using a known method.

The wholly aromatic polyester amide copolymer resin may be dissolved in a solvent.

Accordingly, the wholly aromatic polyester amide copolymer resin may be coated on a metal foil in a varnish form in which the wholly aromatic polyester amide copolymer resin is dissolved in a solvent to manufacture a flexible metal clad laminate and then dried and heat treated to form a polymer film. Hence, a polymer film forms as a form attached to a metal foil due to the drying and the heat treatment.

Also, the wholly aromatic polyester amide copolymer resin may be used for various uses other than the flexible metal clad laminate.

The solvent that dissolves the wholly aromatic polyester amide copolymer resin may be used in a content ratio of about 100 to about 100,000 parts by weight based on 100 parts by weight of the wholly aromatic polyester amide copolymer resin, and when the content ratio of the solvent is within the range above, the wholly aromatic polyester amide copolymer resin sufficiently dissolves in the solvent and has good productivity.

As a solvent that dissolves the wholly aromatic polyester amide copolymer resin, a non-halogen solvent such as N,N-dimethyl acetamide (DMAc) or N-methyl-2-pyrrolidone (NMP) may be used.

Accordingly, because the wholly aromatic polyester amide copolymer resin dissolves well even in a non-halogen solvent, the wholly aromatic polyester amide copolymer resin may be used for manufacturing a flexible metal clad laminate or a flexible printed circuit board without using a solvent containing a halogen element. When a solvent containing a halogen element is used, problems in manufacturing processes may occur, and in particular, environmental hormones harmful to a human to body may be generated when the halogen element is incinerated or decomposed A flexible metal clad laminate according to an embodiment of the present invention includes a wholly aromatic polyester amide copolymer resin film having low dielectric properties and low hygroscopicity and a metal foil having excellent mechanical strength. Accordingly, the flexible metal clad laminate has excellent dimensional stability and may be applied in various fields as a flexible substrate material.

Also, a thermal expansion coefficient of the polymer film may be 16 ppm/K or less. When the thermal expansion coefficient of the polymer film is within the range above, warpage or contraction may not occur in the flexible metal clad laminate including the polymer film.

Also, a dielectric constant (1 GHz) of the polymer film may be 3.5 or less and dielectric loss (1 GHz) may be 0.01 or less. Also, the term 'dielectric loss' used herein indicates an energy loss from a dielectric material (i.e., the polymer film) by heat when an alternating electric field is applied to the dielectric material. If the dielectric constant and the dielectric loss are respectively within the ranges described above, the prepreg including the cured product is suitable for an insulating base in a high frequency field. When the dielectric constant and the dielectric loss are each within the ranges above, the polymer film may be used as an insulating substrate in a high frequency region.

Also, a hygroscopicity of the polymer film may be 0.5% or less. When the hygroscopicity of the polymer film is within the range above, resistance to moisture is high and thus, reliability of the flexible metal clad laminate increases.

Also, a glass transition temperature of the polymer film may be about 250° C. to about 350° C. When the glass transition temperature of the polymer film is within the range above, the polymer film may have heat resistance to a reflow process during the manufacturing process of the flexible printed circuit board using the polymer film.

A thermal expansion coefficient, a dielectric constant, dielectric loss, hygroscopicity, and a glass transition temperature of the polymer film may be measured after passing through the following processes. Hence, after coating a composition solution (varnish which is a solution prepared by dissolving the wholly aromatic polyester amide copolymer resin in a solvent) on a metal foil, drying and heat treating the same to manufacture a flexible metal clad laminate, all of the metal foil is removed from the flexible metal clad laminate and the residual polymer film is analyzed to measure the properties described above.

The metal foil may include at least one selected from the group consisting of a copper foil and an aluminum foil.

A thickness of the polymer film in the flexible metal clad laminate may be about 1 μm to about 100 μm. When the thickness of the flexible metal clad laminate is within the range above, cracks may not occur during a winding processing and a multilayered laminate having a limited thickness may be obtained.

The thickness of the metal foil may be about 1 μm to about 70 μm. When the thickness of the metal foil is within the range above, the metal foil may be lightweight, short, and small and is easy for forming a pattern.

A metal foil of the flexible metal clad laminate may be etched, and a circuit may be formed to manufacture a flexible printed circuit board. Also, a metal circuit pattern may be printed on at least one surface of the polymer film to manufacture the flexible printed circuit board. Also, a through hole or the like may be formed on the flexible printed circuit board as needed.

A thickness of the flexible printed circuit board may be about 2 μm to about 170 μm. When the thickness of the flexible printed circuit board is within the range above, the flexible printed circuit board may be lightweight, short, and small, and the flexible printed circuit board may have high flexibility.

Hereinafter, the present invention will be described in detail with reference to Examples but the present invention is not limited thereto.

EXAMPLE

Examples 1 and 2, and Comparative Examples 1 to 10

(1) Process 1: Preparing a Wholly Aromatic Polyester Amide Copolymer Resin 6-hydroxy-2-naphthoic acid (HNA), 4-aminophenol (AP), isophthalic acid (IPA), bisphenol A (BPA) and 4-aminobezoic acid (ABA) were introduced to a reactor in which an agitator, a nitrogen gas injection tube, a thermometer, and a reflux condenser are provided, nitrogen gas was injected to the reactor to make an internal space of the reactor inert and then acetic acid anhydride (Ac2O) was further added to the reactor. Contents (parts by mole) of monomers introduced to the reactor are shown in Table 1 below. Thereafter, a temperature of the reactor was increased to 140° C. over 1 hour and refluxed at the temperature for 2 hours while acetylating hydroxy groups of the monomers. Thereafter, acetic acid generated from the acetylation reaction was removed while increasing the temperature of the reactor to 300° C. over 4 hours to prepare a wholly aromatic polyester amide copolymer prepolymer by a condensation polymerization reaction of the monomers. Also, acetic acid was further produced as a byproduct while the prepolymer was prepared, and the acetic acid was also continuously removed along with the acetic acid produced in the acetylation reaction while the prepolymer was being prepared. Thereafter, the prepolymer was retrieved from the reactor to be cooled and solidified.

Thereafter, the wholly aromatic polyester amide copolymer prepolymer was pulverized to an average particle size of 1 mm, 20 kg of the pulverized wholly aromatic polyester amide copolymer prepolymer was introduced to a rotary kiln reactor having a capacity of 100 L, nitrogen was continuously flowed into the reactor at a flow rate of about 1 N m$^3$/hour while increasing a temperature of the reactor to 200° C., which is a weight loss initiating temperature, over one hour, then the temperature was increased again to 320° C. over 10 hours, and maintained at the temperature for 3 hours to prepare a wholly aromatic polyester amide copolymer resin. Thereafter, the reactor was cooled to room temperature over 1 hour and the wholly aromatic polyester amide copolymer resin was retrieved from the reactor.

(2) Process 2: Preparing a Composition Solution of a Wholly Aromatic Polyester Amide Copolymer Resin 300 g of the wholly aromatic polyester amide copolymer resin powder prepared in the Process 1 was added to 700 g of N-methyl-2-pyrrolidone (NMP), and then agitated at a high temperature (180° C.) for 4 hours to obtain a composition solution of the wholly aromatic polyester amide copolymer resin.

(3) Process 3: Manufacturing a Copper Clad Laminate

The composition solution of the wholly aromatic polyester amide copolymer resin prepared in the Process 2 was coated on a surface of a copper foil having a thickness of 18 μm. Thereafter, the coated composition solution of the wholly aromatic polyester amide copolymer resin was dried at a temperature of 160° C. Then, the temperature was increased to 300° C. to improve properties and to proceed the reaction to manufacture a copper clad laminate. The copper clad laminate includes a polymer film as a form attached to the copper foil.

TABLE 1

| | HNA (part by mole) | AP (part by mole) | IPA (part by mole) | BPA (part by mole) | ABA (part by mole) | Ac$_2$O (part by mole) |
|---|---|---|---|---|---|---|
| Example 1 | 20 | 30 | 30 | 10 | 10 | 110 |
| Example 2 | 25 | 25 | 25 | 10 | 15 | 110 |
| Comparative Example 1 | 2 | 35 | 35 | 20 | 8 | 110 |
| Comparative Example 2 | 45 | 20 | 20 | 5 | 10 | 110 |
| Comparative Example 3 | 25 | 5 | 40 | 15 | 15 | 110 |
| Comparative Example 4 | 10 | 50 | 20 | 10 | 10 | 110 |
| Comparative Example 5 | 25 | 40 | 5 | 15 | 15 | 110 |

TABLE 1-continued

| | HNA (part by mole) | AP (part by mole) | IPA (part by mole) | BPA (part by mole) | ABA (part by mole) | Ac₂O (part by mole) |
|---|---|---|---|---|---|---|
| Comparative Example 6 | 10 | 20 | 50 | 10 | 10 | 110 |
| Comparative Example 7 | 25 | 30 | 30 | 2 | 13 | 110 |
| Comparative Example 8 | 10 | 20 | 20 | 40 | 10 | 110 |
| Comparative Example 9 | 25 | 30 | 30 | 13 | 2 | 110 |
| Comparative Example 10 | 10 | 20 | 20 | 10 | 40 | 110 |

Comparative Example 11

A copper clad laminate (Pyralux AC) manufactured by SD Flex Co., Ltd including a polyimide resin film was obtained.

Evaluation Example

Evaluation Example 1

Evaluation of Properties of a Resin

Weight average molecular weight and glass transition temperature of the wholly aromatic polyester amide copolymer resins prepared in Examples 1 and 2, and Comparative Examples 1 to 10, respectively, were measured and shown in Table 2 below. However, property data of a resin included in the copper clad laminate of Comparative Example 11 could not be obtained.

TABLE 2

| | Weight average molecular weight | Glass transition temperature (° C.) |
|---|---|---|
| Example 1 | 11,000 | 230 |
| Example 2 | 12,000 | 240 |
| Comparative Example 1 | 9,500 | 175 |
| Comparative Example 2 | 12,000 | 255 |
| Comparative Example 3 | 13,000 | 210 |
| Comparative Example 4 | 8,500 | 245 |
| Comparative Example 5 | 9,000 | 250 |
| Comparative Example 6 | 9,500 | 210 |
| Comparative Example 7 | 10,000 | 235 |
| Comparative Example 8 | 10,500 | 210 |
| Comparative Example 9 | 10,000 | 220 |
| Comparative Example 10 | 10,500 | 230 |
| Comparative Example 11 | — | — |

In Table 2, the weight average molecular weight was measured by using GPC with THF eluent at a temperature of 30° C. and the glass transition temperature was measured by using DSC while increasing the temperature at a rate of 20° C./min.

Referring to the Table 2 above, the weight average molecular weight was not found to have a big difference between the Examples and the Comparative Examples, but the glass transition temperature was found to have a big difference due to structural differences between final polymer chains. More particularly, the wholly aromatic polyester amide copolymer resin of Comparative Example 1 was found to have a very low glass transition temperature. Accordingly, a copolymer resin prepared in Comparative Example 1 has low thermal properties and thus, the copolymer resin is difficult to pass through a reflow process even if an additional heat treatment process is performed.

Evaluation Example 2

Evaluation of Properties of a Copper Clad Laminate

Copper clad laminates of the Examples 1 and 2, and Comparative Examples 1 to 11 were analyzed to measure the bending endurance, bending property, and the copper foil peel strength thereof and the measurements are shown in Table 3 below. With respect to the bending property, the smaller the value, the better the bending property.

TABLE 3

| | Bending endurance (number of times) | Bending property (mm) | Copper foil peel strength (N/mm) |
|---|---|---|---|
| Example 1 | 7,200 | 5 | 14 |
| Example 2 | 7,800 | 2 | 14 |
| Comparative Example 1 | 5,500 | 15 | 8 |
| Comparative Example 2 | 7,500 | 11 | 10 |
| Comparative Example 3 | 4,200 | 15 | 8 |
| Comparative Example 4 | 4,600 | 10 | 9 |
| Comparative Example 5 | 6,300 | 9 | 10 |
| Comparative Example 6 | 3,800 | 18 | 7 |
| Comparative Example 7 | 6,200 | 10 | 11 |
| Comparative Example 8 | 7,500 | 12 | 8 |
| Comparative Example 9 | 6,100 | 10 | 11 |
| Comparative Example 10 | 5,800 | 10 | 10 |
| Comparative Example 11 | 6,500 | 5 | 10 |

In Table 3, the bending endurance, bending property, and the copper foil peel strength were evaluated by using the following methods.

<Bending Endurance>

Bending test specimens were prepared by bonding a coverlay (polyimide film 12 μm, adhesive 25 μm) to a surface of the respective flexible copper clad laminates (the surface on which a circuit is formed). The test specimens were mounted on MIT bending test equipment (TOYOSEIKI, MIT-SA), a jig having a radius curvature of 0.38 R was repeatedly rotated at a rate of 175 rpm, and the number of rotations of the jig was to measured until the test specimens broke.

<Bending Property>

Test specimens were prepared by cutting the respective flexible copper clad laminates into the size of 10 cm×10 cm. Then, the test specimens were located on a flat plate, the height from the flat plate to each rolled up corner of the flexible copper clad laminate (mm), and an average value of the measured heights was calculated.

<Copper Foil Peel Strength>

The copper foil peel strength was measured according to the IPC-TM-650 2.4.9 standard.

Referring to Table 3, at least two physical properties among bending endurance, bending property and copper foil peel strength were better in the copper clad laminates of Examples 1 to 2 than those of Comparative Examples 1 to 11.

Evaluation Example 3

Evaluation of the Physical Properties of the Polymer Film Contained in the Copper Clad Laminate The copper foils were completely eliminated by etching from the respective copper clad laminates of Examples 1 to 2 and Comparative Examples 1 to 11, and the to remaining polymer films were analyzed. The thermal expansion coefficient, dielectric properties, hygroscopicity and glass transition temperature were measured respectively and shown in Table 4.

TABLE 4

| | Thermal expansion coefficient (ppm/K) | Dielectric constant (@1 GHz) | Dielectric loss (@1 GHz) | Hygroscopicity (wt %) | Glass transition temperature (° C.) |
|---|---|---|---|---|---|
| Example 1 | 15 | 3.0 | 0.004 | 0.2 | 270 |
| Example 2 | 15 | 3.0 | 0.004 | 0.2 | 280 |
| Comparative Example 1 | 20 | 3.8 | 0.005 | 0.4 | 230 |
| Comparative Example 2 | 20 | 3.6 | 0.005 | 0.7 | 240 |
| Comparative Example 3 | 25 | 3.6 | 0.005 | 0.7 | 220 |
| Comparative Example 4 | 20 | 3.5 | 0.005 | 0.3 | 240 |
| Comparative Example 5 | 18 | 3.2 | 0.005 | 0.4 | 250 |
| Comparative Example 6 | 30 | 3.8 | 0.005 | 0.8 | 200 |
| Comparative Example 7 | 20 | 3.2 | 0.005 | 0.5 | 240 |
| Comparative Example 8 | 22 | 3.3 | 0.005 | 0.5 | 230 |
| Comparative Example 9 | 17 | 3.2 | 0.005 | 0.7 | 250 |
| Comparative Example 10 | 25 | 3.5 | 0.005 | 0.5 | 260 |
| Comparative Example 11 | 24 | 3.8 | 0.005 | 1.2 | >300 |

In Table 4 above, the thermal expansion coefficient was measured by using a TMA (TMA Q400) in a temperature range of about 50° C. to about 150° C., the dielectric constant and dielectric loss were measured by using an impedance analyzer (available from Agilent, E4991A), hygroscopicity was measured by using an IPC-TM-650 2.6.2.1 standard, and glass transition temperature was measured by using an IPC-TM-650 2.4.24.2 standard.

Referring to the Table 4 above, the polymer films prepared in Examples 1 and 2 had lower thermal expansion coefficient, dielectric constant, dielectric loss, and hygroscopicity, but higher dimension stability and glass transition temperature than the polymer film prepared in Comparative Examples 1 to 10. Also, the polymer films prepared in Examples 1 and 2 had lower thermal expansion coefficient, dielectric constant, dielectric loss, hygroscopicity, and glass transition temperature than the polymer film prepared in Comparative Example 11.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A wholly aromatic polyester amide copolymer resin comprising;
   5-25 parts by mole of a repeating unit (A) derived from an aromatic hydroxyl carboxylic acid;
   20-40 parts by mole of at least one repeating unit selected from the group consisting of a repeating unit (13) derived from an aromatic amine having a phenolic hydroxyl group and a repeating unit (B') derived from an aromatic diamine;
   20-40 parts by mole of a repeating unit (C) derived from an aromatic dicarboxylic acid;
   5-20 parts by mole of a repeating unit (D) derived from an aromatic diol, wherein the repeating unit (D) is derived from at least one compound selected from the group containing bisphenol A, 4,4'-biphenol and hydroquinone; and
   5-20 parts by mole of a repeating unit (E) derived from an aromatic amino carboxylic acid.

2. The wholly aromatic polyester amide copolymer resin of claim 1, wherein the repeating unit (A) is derived from at least one compound selected from the group consisting of para-hydroxy benzoic acid, meta-hydroxy benzoic acid, 6-hydroxy-2-naphthoic acid, 3-hydroxy-2-naphthoic acid, 1-hydroxy-2-naphthoic acid, and 2-hydroxy-1-naphthoic acid; the repeating unit (B) is derived from at least one compound selected from the group consisting of 3-aminophenol, 4-aminophenol, 5-amino-1-naphthol, 8-amino-2-naphthol, and 3-amino-2-naphthol; the repeating unit (B') is derived from at least one compound selected from the group consisting of 1,4-phenylenediamine, 1,3-phenylenediamine, 1,5-diaminonaphthalene, 2,3-diaminonaphthalene, and 1,8-diaminonaphthalene; the repeating unit (C) is derived from at least one compound selected from the group consisting of isophthalic acid, naphthalene dicarboxylic acid, and terephthalic acid; and the repeating unit (E) may be derived from at least one compound selected from the group containing 4-aminobenzoic acid, 2-amino-naphthalene-6-carboxylic acid and 4'-amino-biphenyl-4-carboxylic acid.

3. The wholly aromatic polyester amide copolymer resin of claim 1 having a weight average molecular weight of about 1,000 to about 100,000 and a glass transition temperature of about 200° C. to about 300° C.

4. A polymer film comprising the wholly aromatic polyester amide copolymer resin of claim 1.

5. The polymer film of claim 4, wherein a thermal expansion coefficient in one direction is 16 ppm/K or less.

6. The polymer film of claim 4, wherein a dielectric constant (1 GHz) is 3.5 or less and dielectric loss (1 GHz) is 0.01 or less.

7. The polymer film of claim 4, wherein a hygroscopicity is 0.5 wt % or less.

8. The polymer film of claim 4, wherein a glass transition temperature is about 250° C. to about 350° C.

9. A flexible metal clad laminate comprising the polymer film of claim 1; and at least one metal foil disposed on at least one surface of the polymer film.

10. The flexible metal clad laminate of claim 9, wherein the metal foil comprises at least one of a copper foil and an aluminum foil.

11. A flexible printed circuit board obtained by etching the metal foil of the flexible metal clad laminate of claim 9.

12. A flexible printed circuit board formed by printing a metal circuit pattern on at least one surface of the polymer film of claim 4.

13. A polymer film comprising the wholly aromatic polyester amide copolymer resin of claim 2.

14. A polymer film comprising the wholly aromatic polyester amide copolymer resin of claim 3.

15. A flexible metal clad laminate comprising the polymer film of claim 2; and at least one metal foil disposed on at least one surface of the polymer film.

16. A flexible metal clad laminate comprising the polymer film of claim 3; and at least one metal foil disposed on at least one surface of the polymer film.

* * * * *